United States Patent
Nobukuni et al.

(10) Patent No.: US 9,512,329 B2
(45) Date of Patent: Dec. 6, 2016

(54) RESIN COMPOSITION, PREPREG, AND LAMINATE

(75) Inventors: Takeshi Nobukuni, Tokyo (JP); Yoshihiro Kato, Tokyo (JP); Meguru Ito, Tokyo (JP); Tomoki Hamajima, Tokyo (JP)

(73) Assignee: MITSUBISHI GAS CHEMICAL COMPANY, INC., Tokyo (JP)

(*) Notice: Subject to any disclaimer, the term of this patent is extended or adjusted under 35 U.S.C. 154(b) by 487 days.

(21) Appl. No.: 14/119,342

(22) PCT Filed: May 23, 2012

(86) PCT No.: PCT/JP2012/063130
§ 371 (c)(1),
(2), (4) Date: Feb. 19, 2014

(87) PCT Pub. No.: WO2012/165240
PCT Pub. Date: Dec. 6, 2012

(65) Prior Publication Data
US 2014/0227924 A1  Aug. 14, 2014

(30) Foreign Application Priority Data
May 27, 2011 (JP) ................................ 2011-119402

(51) Int. Cl.
| | |
|---|---|
| B32B 15/092 | (2006.01) |
| B32B 27/04 | (2006.01) |
| B32B 27/20 | (2006.01) |
| B32B 27/26 | (2006.01) |
| B32B 27/38 | (2006.01) |
| C08L 63/00 | (2006.01) |
| C08G 59/24 | (2006.01) |
| C08G 59/32 | (2006.01) |
| C08G 59/38 | (2006.01) |
| C08G 59/40 | (2006.01) |
| C08K 3/22 | (2006.01) |
| C08K 3/26 | (2006.01) |
| C08K 3/28 | (2006.01) |
| C08K 3/34 | (2006.01) |
| C08K 3/36 | (2006.01) |
| C08K 3/38 | (2006.01) |
| C08K 5/5415 | (2006.01) |
| C09D 163/00 | (2006.01) |
| C08J 5/24 | (2006.01) |
| H05K 1/03 | (2006.01) |

(52) U.S. Cl.
CPC .......... C09D 163/00 (2013.01); C08G 59/245 (2013.01); C08G 59/38 (2013.01); C08G 59/4014 (2013.01); C08J 5/24 (2013.01); C08L 63/00 (2013.01); H05K 1/0353 (2013.01); H05K 1/0373 (2013.01); C08J 2363/00 (2013.01); C08J 2479/04 (2013.01); C08J 2483/04 (2013.01); H05K 2201/012 (2013.01); H05K 2201/0209 (2013.01); H05K 2201/0212 (2013.01); Y10T 428/31529 (2015.04); Y10T 442/2008 (2015.04); Y10T 442/2951 (2015.04)

(58) Field of Classification Search
None
See application file for complete search history.

(56) References Cited

U.S. PATENT DOCUMENTS

| | | | | |
|---|---|---|---|---|
| 7,601,429 B2* | 10/2009 | Kato | ........................ | B32B 15/08 428/447 |
| 8,815,401 B2* | 8/2014 | Kato | ........................ | C08L 79/04 428/413 |
| 8,815,986 B2* | 8/2014 | Ueno | ........................ | C08J 5/24 524/104 |
| 8,852,734 B2* | 10/2014 | Tanaka | ............... | C08G 59/4014 428/297.4 |
| 2008/0187763 A1* | 8/2008 | Kato | ........................ | B32B 15/08 428/418 |
| 2009/0017316 A1 | 1/2009 | Kato et al. | | |
| 2011/0083890 A1* | 4/2011 | Tanaka | ............... | C08G 59/4014 174/258 |

(Continued)

FOREIGN PATENT DOCUMENTS

| | | |
|---|---|---|
| EP | 1961554 | 8/2008 |
| JP | 08-48001 | 2/1996 |

(Continued)

OTHER PUBLICATIONS
Machine translation of JP 2009-024056 A (no date).*

(Continued)

*Primary Examiner* — Michael J Feely
(74) *Attorney, Agent, or Firm* — Greenblum & Bernstein, P.L.C.

(57) ABSTRACT

A resin composition contains a cyanate ester compound, a maleimide compound, an epoxy resin, a silicone rubber powder, and an inorganic filler. The cyanate ester compound contains a compound represented by the following formula. The silicone rubber powder is contained in an amount of 40 to 150 parts by mass based on 100 parts by mass in total of the cyanate ester compound, the maleimide compound, and the epoxy resin. The inorganic filler is contained in an amount of 100 to 340 parts by mass based on 100 parts by mass in total of the cyanate ester compound, the maleimide compound, and the epoxy resin. A total content of the silicone rubber powder and the inorganic filler is 140 to 380 parts by mass based on 100 parts by mass in total of the cyanate ester compound, the maleimide compound, and the epoxy resin.

[Formula 1]

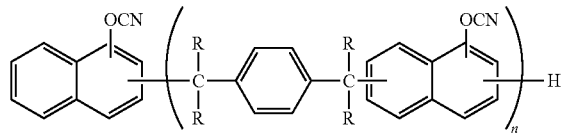

(I)

17 Claims, No Drawings

(56) References Cited

U.S. PATENT DOCUMENTS

| | | | |
|---|---|---|---|
| 2012/0018072 A1 | 1/2012 | Ueno et al. | |
| 2012/0111621 A1 | 5/2012 | Ohigashi | |
| 2013/0045650 A1 | 2/2013 | Ogashiwa et al. | |
| 2013/0136930 A1* | 5/2013 | Kato ................ | H05K 1/0373 428/418 |

FOREIGN PATENT DOCUMENTS

| | | |
|---|---|---|
| JP | 2000-158589 | 6/2000 |
| JP | 3173332 | 3/2001 |
| JP | 2002-194120 | 7/2002 |
| JP | 2003-246849 | 9/2003 |
| JP | 2005-048036 | 2/2005 |
| JP | 2006-143973 | 6/2006 |
| JP | 2007-002071 | 1/2007 |
| JP | 2007-291368 | 11/2007 |
| JP | 2008-031344 | 2/2008 |
| JP | 2009-024056 | 2/2009 |
| JP | 2009-035728 | 2/2009 |
| JP | 2009-067852 | 4/2009 |
| WO | 2010/109861 | 9/2010 |
| WO | 2011/010672 | 1/2011 |
| WO | WO 2011/108524 A1 * 9/2011 ............ C08G 59/24 |  |

OTHER PUBLICATIONS

United States Office Action in respect to U.S. Appl. No. 13/581,926(US 2013/0045650), mailed Apr. 29, 2016.

Search report from International Patent Appl. No. PCT/JP2012/063130, mail date is Aug. 7, 2012.

* cited by examiner

RESIN COMPOSITION, PREPREG, AND LAMINATE

TECHNICAL FIELD

The present invention relates to a resin composition, and more specifically relates to a resin composition used in prepregs for printed wiring boards, a prepreg containing the resin composition impregnated into or coated on a substrate, and a laminate obtained by curing the prepreg.

BACKGROUND ART

In recent years, there are increasingly accelerated higher integration, higher functionality, and higher density mounting of semiconductors extensively used in electronic equipments, communication instruments, and personal computers or the like. This demands better properties and higher reliability of laminates for semiconductor plastic packages. From a growing interest in environmental problems, a laminate having heat resistance high enough to be applicable to a reflow process at high temperatures is demanded in order to use lead-free solders.

In recent years, a reduction in coefficient of thermal expansion in a plane direction of laminates is strongly demanded. When the difference in coefficient of thermal expansion between a semiconductor element and a printed wiring board for a semiconductor plastic package is large, warpage occurs in the semiconductor plastic package due to the difference in coefficient of thermal expansion upon exposure to thermal shock, which may cause poor connection between the semiconductor element and the printed wiring board for a semiconductor plastic package or between the semiconductor plastic package and the printed wiring board mounted. An increase in heat value caused by the high-density of the printed wiring board has demanded a very low coefficient of thermal expansion in the plane direction.

A method for filling a resin composition as a raw material with an inorganic filler is known as a general method for reducing the coefficient of thermal expansion in the plane direction of the laminate. A large amount of the inorganic filler to be filled reduces the coefficient of thermal expansion. However, this poses a problem that the moldability of the laminate is lowered.

The incorporation of an organic filler having rubber elasticity in a resin composition is known as other technique for a reduction in thermal expansion in a plane direction (for example, Patent Literatures 1 to 5 or the like). However, such a laminate containing the organic filler has a drawback of lowered flame retardance.

In order to solve this problem, use of a silicone rubber powder instead of an organic filler is proposed (Patent Literature 6). However, even the proposed material has not yet reached a sufficiently low coefficient of thermal expansion demanded in recent years. A material having a lower coefficient of thermal expansion has been desired.

CITATION LIST

Patent Literature

Patent Literature 1: Japanese Patent No. 3173332
Patent Literature 2: Japanese Patent Laid-Open No. 08-48001
Patent Literature 3: Japanese Patent Laid-Open No. 2000-158589
Patent Literature 4: Japanese Patent Laid-Open No. 2003-246849
Patent Literature 5: Japanese Patent Laid-Open No. 2006-143973
Patent Literature 6: Japanese Patent Laid-Open No. 2009-035728

SUMMARY OF INVENTION

Technical Problem

The present inventors have found that, in a resin composition containing a specific cyanate ester compound, maleimide compound, epoxy resin, silicone rubber powder, and inorganic filler, the silicone rubber powder and the inorganic filler are contained in a specific ratio, which can reduce the coefficient of thermal expansion of a printed wiring board containing the resin composition and obtain a printed wiring board having excellent heat resistance and flame retardance while maintaining moldability. The present invention has been made based on such finding.

Accordingly, it is an object of the present invention to provide a resin composition having excellent heat resistance, flame retardance, and moldability, and capable of particularly providing a resin cured product with a low coefficient of thermal expansion. It is another object of the present invention to provide a prepreg containing the above resin composition, and a laminate thereof.

Solution to Problem

A resin composition according to the present invention contains a cyanate ester compound (A), a maleimide compound (B), an epoxy resin (C), a silicone rubber powder (D), and an inorganic filler (E), wherein the cyanate ester compound (A) contains a compound represented by the following formula (I):

[Formula 1]

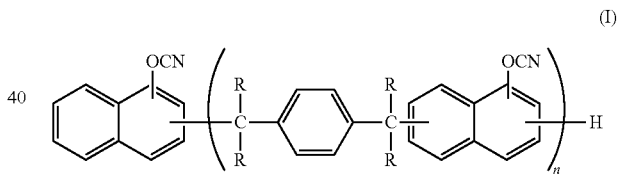

wherein R represents a hydrogen atom or a methyl group, and n represents an integer of 1 or more;

the silicone rubber powder (D) is contained in an amount of 40 to 150 parts by mass based on 100 parts by mass in total of the cyanate ester compound (A), the maleimide compound (B), and the epoxy resin (C);

the inorganic filler (E) is contained in an amount of 100 to 340 parts by mass based on 100 parts by mass in total of the cyanate ester compound (A), the maleimide compound (B), and the epoxy resin (C); and a total content of the silicone rubber powder (D) and the inorganic filler (E) is 140 to 380 parts by mass based on 100 parts by mass in total of the cyanate ester compound (A), the maleimide compound (B), and the epoxy resin (C).

According to an embodiment of the present invention, the inorganic filler (E) is at least one selected from the group consisting of silicas, a metal hydrate, zinc borate, aluminum oxide, boron nitride, magnesium oxide, aluminum nitride, silicon nitride, and magnesium carbonate.

According to an embodiment of the present invention, the inorganic filler (E) contains the silicas.

According to an embodiment of the present invention, the epoxy resin (C) contains a polyoxynaphthylene-based epoxy resin represented by the following formula (II):

[Formula 2]

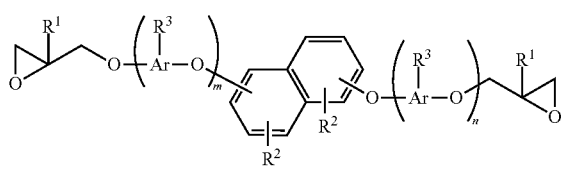

(II)

wherein each of Ar independently represents a naphthylene or phenylene group, provided that at least one hydrogen atom in both the naphthylene and phenylene groups is optionally substituted by an alkyl group having 1 to 4 carbon atoms or a phenylene group;

$R^1$ represents a hydrogen atom or a methyl group;

each of $R^2$ independently represents a hydrogen atom, an alkyl group having 1 to 4 carbon atoms, or an aralkyl group represented by the following formula (III):

[Formula 3]

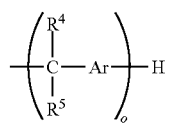

(III)

wherein $R^4$ and $R^5$ each independently represent a hydrogen atom or a methyl group; Ar represents a phenylene or naphthylene group, provided that 1 to 3 hydrogen atoms in the phenylene or naphthylene group are optionally nuclearly substituted by an alkyl group having 1 to 4 carbon atoms; and o is a real number of 0.1 to 4 on average; and $R^3$ represents a hydrogen atom, an aralkyl group represented by the formula (III), or an epoxy group-containing aromatic hydrocarbon group represented by the following formula (IV):

[Formula 4]

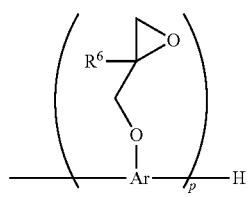

(IV)

wherein $R^6$ represents a hydrogen atom or a methyl group; Ar represents a naphthylene group, provided that at least one hydrogen atom in the naphthylene group is optionally substituted by an alkyl group having 1 to 4 carbon atoms, an aralkyl group, or a phenylene group; and p is an integer of 1 or 2;

m and n each are an integer of 0 to 4, provided that m and n are not simultaneously 0; and the position of binding to the naphthalene structure site may be any of the 1- to 8-positions.

According to an embodiment of the present invention, Ar in the formula (II) is a naphthylene group (at least one hydrogen atom in the naphthylene group is optionally substituted by an alkyl group having 1 to 4 carbon atoms or a phenylene group).

According to an embodiment of the present invention, m and n in the formula (II) are an integer of 0 to 2, provided that m and n are not simultaneously 0.

According to an embodiment of the present invention, the epoxy resin (C) contains at least one or more selected from the group consisting of compounds represented by the following formula (V) and the following formula (VI):

[Formula 5]

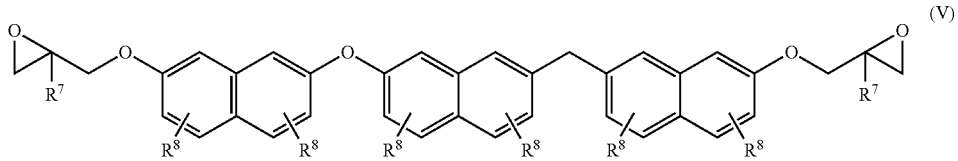

(V)

wherein $R^7$ represents a hydrogen atom or a methyl group; and each of $R^8$ independently represents a hydrogen atom, an alkyl group having 1 to 4 carbon atoms, or an aralkyl group represented by the formula (III):

[Formula 6]

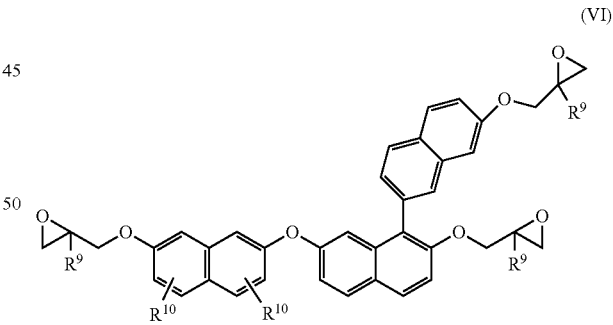

(VI)

wherein $R^9$ represents a hydrogen atom or a methyl group; and each of $R^{10}$ independently represents a hydrogen atom, an alkyl group having 1 to 4 carbon atoms, or an aralkyl group represented by the formula (III).

According to an embodiment of the present invention, the epoxy resin (C) contains a polyoxynaphthylene-based epoxy resin represented by the formula (II) and an anthracene-based epoxy resin.

According to an embodiment of the present invention, the anthracene-based epoxy resin contains a dihydroanthracene-based epoxy resin represented by the following formula (VII):

[Formula 7]

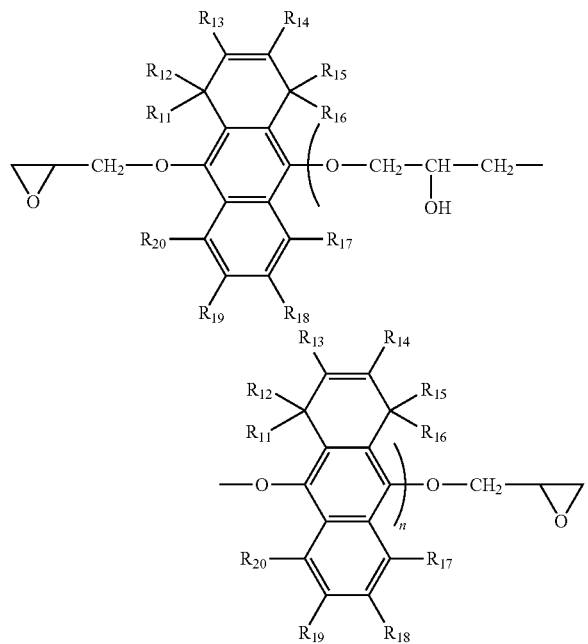

(VII)

wherein $R^{11}$ to $R^{20}$ each independently represent a hydrogen atom or an alkyl group having 1 to 6 carbon atoms; and n represents an integer of 0 or more.

According to an embodiment of the present invention, the cyanate ester compound (A) is contained in an amount meeting a ratio (CN/Ep) in a range of 0.65 to 2.5 wherein CN represents the number of cyanate groups in the cyanate ester compound (A); and Ep represents the number of epoxy groups in the epoxy resin (C).

According to an embodiment of the present invention, the maleimide compound (B) is contained in an amount of 3 to 50 parts by mass based on 100 parts by mass in total of the cyanate ester compound (A), the maleimide compound (B), and the epoxy resin (C).

A prepreg according to the present invention includes: a substrate; and the above resin composition impregnated into or coated on the substrate.

According to an embodiment of the present invention, the substrate is a glass cloth made of S-glass or T-glass.

According to an embodiment of the present invention, provided that warp threads and weft threads of the glass cloth are made of monofilaments with an average diameter of 5 μm or more; the number of the driven warp threads is defined as X (thread/inch); and the number of the driven weft threads is defined as Y (thread/inch), the total of X and Y is 110 to 200.

According to an embodiment of the present invention, provided that warp threads and weft threads of the glass cloth are made of monofilaments with an average diameter of 4.5 μm or less; the number of the driven warp threads is defined as X (thread/inch); and the number of the driven weft threads is defined as Y (thread/inch), the total of X and Y is 130 to 240.

According to another embodiment of the present invention, a laminate obtained by curing the above prepreg is also provided.

According to another embodiment of the present invention, a metal foil-clad laminate obtained by stacking and curing the above prepreg and a metal foil is also provided.

In the resin composition containing the specific cyanate ester compound, maleimide compound, epoxy resin, silicone rubber powder, and inorganic filler, the silicone rubber powder and the inorganic filler are contained in a specific ratio. Therefore, the present invention can achieve a resin composition having excellent heat resistance, flame retardance, and moldability, and capable of particularly providing a resin cured product with a low coefficient of thermal expansion.

DESCRIPTION OF EMBODIMENTS

The resin composition according to the present invention contains a cyanate ester compound (A), a maleimide compound (B), an epoxy resin (C), a silicone rubber powder (D), and an inorganic filler (E) as indispensable ingredients. Hereinafter, individual ingredients constituting the resin composition according to the present invention will be described.

<Cyanate Ester Compound (A)>

The cyanate ester compound (A) used in the present invention is a polymer or prepolymer represented by the above formula (I). Such a cyanate ester compound (A) is obtained by condensation of a cyanic acid and a naphthol aralkyl resin obtained by reacting naphthols such as α-naphthol or β-naphthol with p-xylyleneglycol, α,α'-dimethoxy-p-xylene, 1,4-di(2-hydroxy-2-propyl)benzene or the like. The method of producing the cyanate ester compound (A) is not particularly limited. It may be produced by any existing cyanate ester synthesis method.

The above cyanate ester compound (A) can be produced by reacting a naphthol aralkyl resin represented by the following formula (VIII) with cyanogen halide in the presence of a basic compound in an inactive organic solvent. A salt is formed from the naphthol aralkyl resin and the basic compound described above in a solution containing water. A two-phase system interface reaction of the salt and cyanogen halide is then performed, and thereby the cyanate ester compound (A) can also be produced.

[Formula 8]

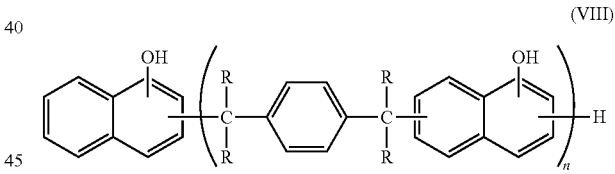

(VIII)

wherein each of R independently represents a hydrogen atom or a methyl group, and n represents an integer of 1 or more.

In the above formula (I), n is preferably 10 or less. The use of such the cyanate ester compound (A) can provide good impregnation of the resin composition to a substrate and maintain performance as a laminate without increasing the viscosity of the resin composition. Because polymerization in a molecule hardly occurs when the cyanate ester compound (A) is synthesized and liquid separability upon water washing is improved, a reduction in a yield can be suppressed.

From the viewpoint of flame retardance and curability, the above cyanate ester compound (A) is preferably contained in the resin composition so that a ratio (CN/Ep) between the number of cyanate groups of the cyanate ester compound (A) in the resin composition and the number of epoxy groups in the epoxy resin (C) is in the range of 0.65 to 2.5.

The cyanate ester compound (A) may be added to the resin composition as a bismaleimide triazine resin (also referred to as a BT resin) prepolymerized with a maleimide compound to be described later.

<Maleimide Compound (B)>

Any compound having one or more maleimide groups per molecule may be used as the maleimide compound (B) used in the present invention without particular limitation. Examples thereof include, but are not limited to, N-phenylmaleimide, N-hydroxyphenylmaleimide, bis(4-maleimidophenyl)methane, 2,2-bis{4-(4-maleimidophenoxy)phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, polyphenylmethane maleimide, prepolymers of these maleimide compounds, and prepolymers of maleimide compounds and amine compounds. The above maleimide compounds may be used singly or in a proper combination of two or more of them. Among them, from the viewpoint of heat resistance and burning resistance, bis(4-maleimidophenyl)methane, 2,2-bis{4-(4-maleimidophenoxy)phenyl}propane, and bis(3-ethyl-5-methyl-4-maleimidophenyl)methane can be suitably used.

In the present invention, a prepolymer represented by the general formula (IX):

[Formula 9]

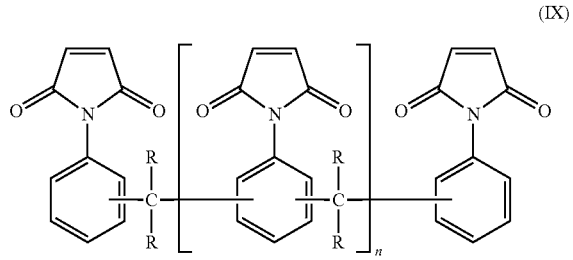

(IX)

wherein R represents a hydrogen atom or a methyl group, and n represents an integer from 1 to 10 as an average value, or a prepolymer of a maleimide compound represented by the general formula (IX) and amine compound can also be used as the maleimide compound (B). Because the compound having the above structure has a novolac structure, the compound has many crosslinking points, and has an effect of raising a glass transition temperature of a cured product. The above maleimide compounds represented by the general formula (IX) may be commercially available products, and examples thereof include BMI-2300 manufactured by Daiwa Fine Chemicals Co., Ltd.

The maleimide compound (B) is preferably contained in an amount of 3 to 50 parts by mass based on 100 parts by mass in total of the cyanate ester compound (A), the maleimide compound (B), and the epoxy resin (C). From the viewpoint of heat resistance and burning resistance, the maleimide compound (B) is more preferably contained in an amount of 5 to 30 parts by mass.

<Epoxy Resin (C)>

Any known compound which has two or more epoxy groups per molecule and does not have a halogen atom in a molecule structure may be used as the epoxy resin (C) used in the present invention without particular limitation. Examples thereof include, but are not limited to, polyoxynaphthylene-based epoxy resins, bisphenol A-based epoxy resins, bisphenol F-based epoxy resins, phenol novolac-based epoxy resins, cresol novolac-based epoxy resins, bisphenol A novolac-based epoxy resins, trifunctional phenol-based epoxy resins, tetrafunctional phenol-based epoxy resins, naphthalene-based epoxy resins, anthracene-based epoxy resins, biphenyl-based epoxy resins, aralkyl novolac-based epoxy resins, alicyclic-based epoxy resins, polyol-based epoxy resins, glycidylamines, glycidyl esters, compounds obtained by epoxidizing a double bond such as butadiene, and compounds obtained by reacting hydroxyl-containing silicone resins with epichlorohydrin. These epoxy resins (C) may be used singly or in a proper combination of two or more of them. The above epoxy resin (C) may be any form of a monomer, an oligomer, and a resin.

Among the above, the polyoxynaphthylene-based epoxy resin is preferable. In particular, the polyoxynaphthylene-based epoxy resin represented by the following formula (II) can be suitably used.

[Formula 10]

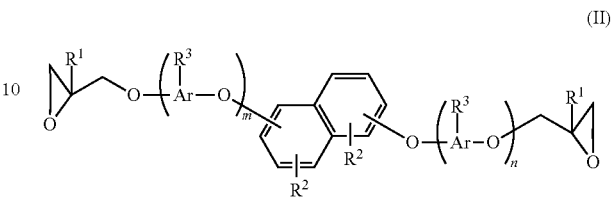

(II)

wherein each of Ar independently represents a naphthylene or phenylene group, provided that at least one hydrogen atom in both the naphthylene and phenylene groups is optionally substituted by an alkyl group having 1 to 4 carbon atoms or a phenylene group;

$R^1$ represents a hydrogen atom or a methyl group;

each of $R^2$ independently represents a hydrogen atom, an alkyl group having 1 to 4 carbon atoms, or an aralkyl group represented by the following formula (III):

[Formula 11]

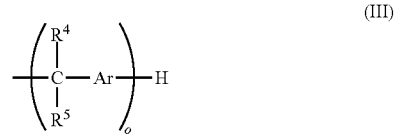

(III)

wherein $R^4$ and $R^5$ each independently represent a hydrogen atom or a methyl group; Ar represents a phenylene or naphthylene group, provided that 1 to 3 hydrogen atoms in the phenylene or naphthylene group are optionally nuclearly substituted by an alkyl group having 1 to 4 carbon atoms; and o is a real number of 0.1 to 4 on average; and $R^3$ represents a hydrogen atom, an aralkyl group represented by the formula (II), or an epoxy group-containing aromatic hydrocarbon group represented by the following formula (III):

[Formula 12]

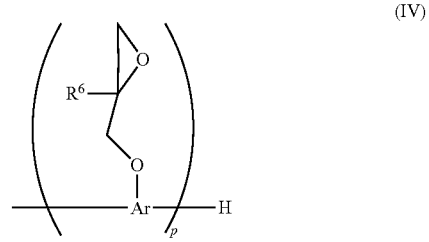

(IV)

wherein $R^6$ represents a hydrogen atom or a methyl group; Ar represents a naphthylene group, provided that at least one hydrogen atom in the naphthylene group is optionally substituted by an alkyl group having 1 to 4 carbon atoms, an aralkyl group, or a phenylene group; and p is an integer of 1 or 2;

m and n each are an integer of 0 to 4, provided that m and n are not simultaneously 0; and the position of binding to the naphthalene structure site may be any of the 1- to 8-positions.

In the present invention, an epoxy resin represented by the following formula (V) or (VI) is preferably used as the above polyoxynaphthylene-based epoxy resin:

[Formula 13]

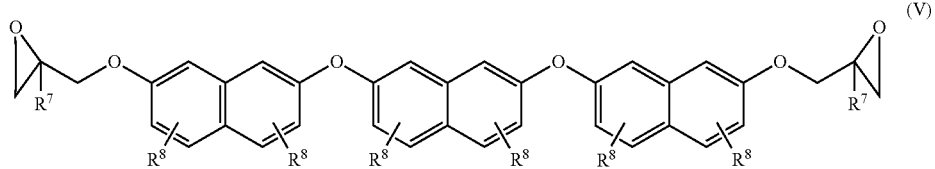

wherein $R^7$ represents a hydrogen atom or a methyl group; and each of $R^8$ independently represents a hydrogen atom, an alkyl group having 1 to 4 carbon atoms, or an aralkyl group represented by the formula (III);

[Formula 14]

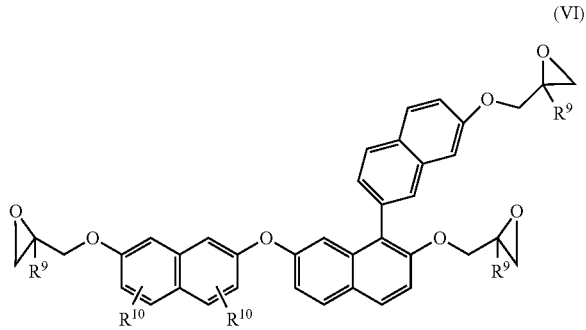

wherein $R^9$ represents a hydrogen atom or a methyl group; and each of $R^{10}$ independently represents a hydrogen atom, an alkyl group having 1 to 4 carbon atoms, or an aralkyl group represented by the formula (III).

The above polyoxynaphthylene-based epoxy resin can be produced by a known method. For example, the polyoxynaphthylene-based epoxy resin can be produced by a method described in Japanese Patent Laid-Open No. 2006-307162. A commercially available polyoxynaphthylene-based epoxy resin may be used.

In the present invention, the above polyoxynaphthylene-based epoxy resin and the anthracene-based epoxy resin are preferably used in combination. A resin cured product with a lower coefficient of thermal expansion can be obtained by using such specific epoxy resins in combination. The anthracene-based epoxy resin means an epoxy resin having a structure containing an anthracene skeleton in a main chain.

A dihydroanthracene-based epoxy resin represented by the following formula (VII) can be suitably used as the anthracene-based epoxy resin used in combination with the polyoxynaphthylene-based epoxy resin.

[Formula 15]

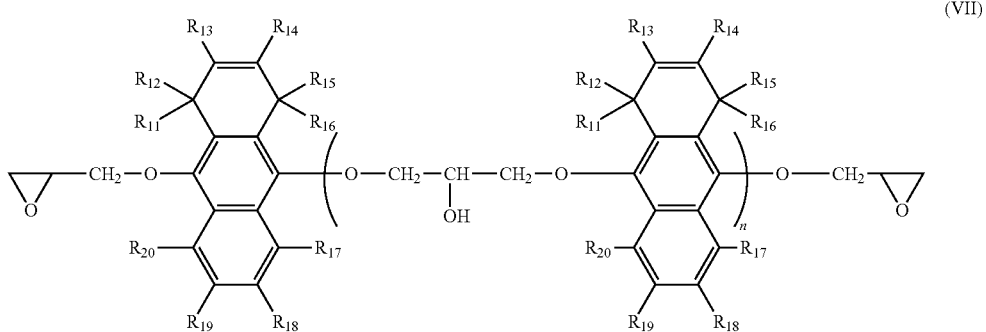

wherein $R^{11}$ to $R^{20}$ each independently represent a hydrogen atom or an alkyl group having 1 to 6 carbon atoms; and n represents an integer of 0 or more.

The above anthracene-based epoxy resin can be produced by a known method. For example, the anthracene-based epoxy resin can be produced by a method described in Japanese Patent Laid-Open No. 2006-249144. A commercially available anthracene-based epoxy resin may be used.

The epoxy resin (C) is preferably contained in an amount of 25 to 65 parts by mass based on 100 parts by mass in total of the cyanate ester compound (A), the maleimide compound (B), and the epoxy resin (C). From the viewpoint of heat resistance and burning resistance, the epoxy resin (C) is more preferably contained in an amount of 30 to 55 parts by mass. When the polyoxynaphthylene-based epoxy resin and the anthracene-based epoxy resin are used in combination, the content of the anthracene-based epoxy resin is preferably 1 to 30 parts by mass based on 100 parts by mass in total of the cyanate ester compound (A), the maleimide compound (B), and the epoxy resin (C). A lower coefficient of thermal expansion can be achieved by including the polyoxynaphthylene-based epoxy resin and the anthracene-based epoxy resin in such contents, and heat resistance and flame retardance can be improved while moldability is maintained.

<Silicone Rubber Powder (D)>

The silicone rubber powder (D) used in the present invention is a fine powder of an addition polymerization product of a vinyl group-containing dimethylpolysiloxane with methylhydrogen polysiloxane. The coefficient of thermal expansion of the resin cured product is effectively lowered by adding the silicone rubber powder into the resin composition. On the other hand, the silicone rubber powder has high cohesion, which may cause insufficient dispersibility of the silicone rubber powder in the resin composition. Therefore, a silicone rubber powder with the surface of the above fine powder coated with a silicone resin to improve the dispersibility is preferably used. Polymethylsilsesquioxane in which a siloxane bond has been crosslinked in a three-dimensional network form can be suitably used as the silicone resin with which the surface is covered. Although the form of the silicone rubber powder is not particularly limited, a silicone rubber powder having a mean particle diameter (D50) in the range of 0.5 to 15 µm is preferably used from the viewpoint of dispersibility. D50 means a median diameter and is a particle diameter when the particle size distribution of the measured powder is divided into two parts and when the number or mass of the particles having a larger particle side is equal to the number or mass of the particles having a smaller particle side. The D50 value is generally measured by a wet laser diffraction scattering method.

In the present invention, it was found that the resin composition containing the above ingredients can achieve both moldability and a low coefficient of expansion even when the silicone rubber powder (D) is added in a specific amount. That is, it was found that the resin composition capable of providing a resin cured product with a lower coefficient of thermal expansion and having excellent moldability can be achieved by adding the silicone rubber powder (D) in a ratio of 40 to 150 parts by mass based on 100 parts by mass in total of the cyanate ester compound (A), the maleimide compound (B), and the epoxy resin (C). The range of the amount to be added is significantly greater than a conventional amount to be added. Unexpectedly, even such the amount to be added can maintain the moldability. From the viewpoint of formability and a coefficient of thermal expansion, the amount to be added is preferably in the range of 45 to 130 parts by mass, and more preferably in the range of 50 to 120 parts by mass.

<Inorganic Filler (E)>

Any inorganic filler commonly used in resin compositions for electrical wiring boards may be used as the inorganic filler (E) used in the present invention without particular limitation. Examples thereof include, but are not limited to, silicas such as natural silica, fused silica, amorphous silica, and hollow silica, metal hydrates such as aluminum hydroxide, an aluminum hydroxide heat-treated product (one obtained by heat-treating aluminum hydroxide and partially reducing crystal water), boehmite, and magnesium hydroxide, molybdenum compounds such as molybdenum oxide and zinc molybdate, zinc borate, zinc stannate, aluminum oxide, clay, kaolin, boron nitride, magnesium oxide, aluminum nitride, silicon nitride, magnesium carbonate, talc, calcined clay, calcined kaolin, calcined talc, mica, glass short fibers (fine powders of glasses such as E-glass and D-glass), and hollow glass. Among them, from the viewpoint of a coefficient of thermal conductivity, silicas, metal hydrates such as aluminum hydroxide, an aluminum hydroxide heat-treated product (one obtained by heat-treating aluminum hydroxide and partially reducing crystal water), boehmite, and magnesium hydroxide, zinc borate, aluminum oxide, boron nitride, magnesium oxide, aluminum nitride, silicon nitride, and magnesium carbonate or the like are preferable, and particularly, silicas can be suitably used. Not only a coefficient of thermal conductivity but also a linear coefficient of expansion can be reduced by containing silicas as the inorganic filler (E). These inorganic fillers may be used singly or in a proper combination of two or more of them.

Preferably, the inorganic filler (E) has a mean particle diameter (D50) of 0.2 to 5 µm from the viewpoint of dispersibility. In the present invention, inorganic fillers having different particle size distributions and mean particle diameters may be used in a proper combination of two or more of them.

In the present invention, it was found that the resin composition containing the above ingredients can achieve both moldability and a low coefficient of expansion even when the inorganic filler (E) is added in a specific amount. That is, it was found that the resin composition capable of providing a resin cured product with a lower coefficient of thermal expansion and having excellent moldability can be achieved by adding the inorganic filler (E) in a ratio of 100 to 340 parts by mass based on 100 parts by mass in total of the cyanate ester compound (A), the maleimide compound (B), and the epoxy resin (C). The range of the amount to be added is greater than a conventional amount to be added. Unexpectedly, even such the amount to be added can maintain the moldability. From the viewpoint of a coefficient of thermal expansion, the amount to be added is preferably in the range of 110 to 330 parts by mass, and more preferably in the range of 120 to 310 parts by mass.

In the present invention, from the viewpoint of achieving both a coefficient of thermal expansion and moldability, the total amount of the silicone rubber powder (D) and the inorganic filler (E) to be incorporated is important. That is, it is necessary to add the silicone rubber powder (D) and the inorganic filler (E) so that the total content of the silicone rubber powder (D) and the inorganic filler (E) is 140 to 380 parts by mass based on 100 parts by mass in total of the cyanate ester compound (A), the maleimide compound (B), and the epoxy resin (C). The content of such the range can provide a resin cured product with a lower coefficient of thermal expansion while maintaining moldability. From the viewpoint of a coefficient of thermal expansion, the range is preferably 150 to 370 parts by mass, and more preferably 160 to 360 parts by mass. The resin composition according to the present invention contains the silicone rubber powder (D) and the inorganic filler (E) of the contents as described above, and thereby the linear coefficient of expansion of the obtained resin cured product can be set to 5 ppm/° C. or less.

The inorganic filler (D) may be added singly to the resin composition, or may be added in combination with silane coupling agents and wet dispersing agents to improve the dispersibility of the inorganic filler and the adhesive strength between the resin and the inorganic filler or the glass cloth. Any silane coupling agent commonly used for surface treatment of inorganic materials may be used without particular limitation. Specific examples thereof include, but are not limited to, aminosilane coupling agents such as γ-aminopropyltriethoxysilane and N-β-(aminoethyl)-γ-aminopropyltrimethoxysilane, epoxysilane coupling agents such as γ-glycidoxypropyltrimethoxysilane, vinylsilane coupling agents such as γ-methacryloxypropyltrimethoxysilane, cationic silane coupling agents such as N-β-(N-vinylbenzylaminoethyl)-γ-aminopropyltrimethoxysilane hydrochloride, and phenylsilane coupling agents. The above silane coupling agents may be used singly or in a proper combination of two or more of them.

Any dispersion stabilizer commonly used for coating materials may be used as the wet dispersing agent without particular limitation. These dispersion stabilizers may be commercially available products. For example, Disperbyk-110, 111, 180, 161, BYK-W996, W9010, and W903 or the like manufactured by BYK Japan K.K. may be suitably used.

<Other Ingredients>

In addition to the above ingredients, if necessary other ingredients may be contained in the resin composition according to the present invention. For example, curing accelerators may be contained in order to properly adjust a curing speed. Any curing accelerator commonly used as curing accelerators for epoxy resins, cyanate ester compounds, and phenolic resins or the like may be used without particular limitation. Examples thereof include, but are not limited to, organometal salts of copper, zinc, cobalt, nickel or the like, imidazoles and derivatives thereof, and tertiary amines. The above curing accelerators may be used singly or in a proper combination of two or more of them.

The resin composition according to the present invention may if necessary contain silicone resin powders as an auxiliary flame-retardant. The amount of the silicone resin powder to be added is not particularly limited. However, from the viewpoint of moldability, the amount of the silicone resin powder to be added is preferably 30 parts by mass or less, and more preferably 25 parts by mass or less, based on 100 parts by mass in total of the cyanate ester compound (A), the maleimide compound (B), and the epoxy resin (C). The silicone resin powder is used also for surface coating of the silicone rubber powder (D) as described above. However, the above content means an amount except an amount to be used as surface coating application of the silicone rubber powder (D).

In the resin composition according to the present invention, various polymeric compounds such as other heat-curable resins, thermoplastic resins, and oligomers or elastomers thereof, other flame-retardant compounds, additives and the like may be added in such a range that does not sacrifice desired properties. Any of them which are commonly used may be used without particular limitation. Examples of the flame-retardant compounds include phosphorus compounds such as a phosphoric ester and melamine phosphate, nitrogen-containing compounds such as melamine and benzoguanamine, oxazine ring-containing compounds, and silicon compounds. The additives include ultraviolet absorbers, antioxidants, photopolymerization initiators, fluorescent brightener, photosensitizers, dyes, pigments, thickeners, lubricants, antifoaming agents, dispersants, leveling agents, brighteners, and polymerization inhibitors. These additives may be used singly or in a proper combination of two or more of them if necessary.

The resin composition according to the present invention may contain organic solvents if necessary. Because the viscosity of the resin composition is lowered by containing the organic solvents, the handleability can be improved. Any organic solvent may be used without particular limitation as long as the mixture of the cyanate ester compound (A) and the epoxy resin (B) can be dissolved therein. Examples thereof include, but are not limited to, ketones such as acetone, methyl ethyl ketone, methyl isobutyl ketone, and cyclohexanone, aromatic hydrocarbons such as benzene, toluene, and xylene, and amides such as dimethylformamide and dimethylacetamide. These organic solvents may be used singly or in a proper combination of two or more of them.

<Method of Producing Resin Composition>

The resin composition according to the present invention can be obtained by mixing the cyanate ester compound (A), the maleimide compound (B), the epoxy resin (C), the silicone rubber powder (D), the inorganic filler (E) described above, and if necessary, the other ingredients. The mixing method is not particularly limited. The resin composition can be produced by dissolving the cyanate ester compound (A), the maleimide compound (B), and the epoxy resin (C) in a proper organic solvent, adding the silicone rubber powder (D) and the inorganic filler (E) to the solution, and stirring the mixture for 30 to 120 minutes in a dissolver or a homomixer.

<Prepreg>

The prepreg according to the present invention includes the above resin composition impregnated into or coated on a substrate. Known substrates used in various materials for printed wiring boards may be used. Examples thereof include inorganic fibers such as E-glass, D-glass, S-glass, NE-glass, and quartz fibers, and organic fibers such as polyimide, polyamide, polyester, and poly(p-phenylene benzobisoxazole) fibers. These substrates may be properly selected depending upon contemplated applications and properties. These substrates may be used singly or in a proper combination of two or more of them if necessary. Among these substrates, a glass cloth made of S-glass or T-glass can be suitably used. A resin cured product having a lower coefficient of thermal expansion can be obtained by combining these substrates with the resin composition according to the present invention.

A woven fabric made from yarns each being a bundle of 50 to 400 glass monofilaments with an average diameter in section of 3.5 to 7.5 μm can be preferably used as the glass cloth. Among such glass clothes, a glass cloth can be suitably used, wherein provided that warp threads and weft threads are made of monofilaments with an average diameter of 5 μm or more; the number of the driven warp threads is defined as X (thread/inch); and the number of the driven weft threads is defined as Y (thread/inch), the total of X and Y is 110 to 200. In particular, from the viewpoint of thermal expandability, the total of X and Y is more preferably 120 to 200.

A glass cloth can be suitably used, wherein provided that warp threads and weft threads are made of monofilaments with an average diameter of 4.5 μm or less; the number of the driven warp threads is defined as X (thread/inch); and the number of the driven weft threads is defined as Y (thread/inch), the total of X and Y is 130 to 240. In particular, from the viewpoint of thermal expandability, the total of X and Y is particularly preferably 150 to 240.

The thickness of the glass cloth is not particularly limited. Commonly, the glass cloth having a thickness of approximately 0.01 to 0.30 mm is suitably used.

The prepreg according to the present invention may be produced by impregnating or coating the substrate with the above resin composition. For example, the prepreg is produced by impregnating or coating the substrate with a resin varnish containing the above resin composition and an organic solvent and thereafter heating the impregnated or coated substrate in a drier of 100 to 200° C. for 1 to 60 min to semi-cure the resin. The amount of the resin composition (including the inorganic filler) deposited on the substrate is preferably in the range of 20 to 90% by mass based on the whole prepreg.

<Laminate>

The laminate according to the present invention is obtained by stacking the above prepregs and molding (curing) the stack of the prepregs. The laminate is produced by providing a single prepreg or stacking prepregs, desirably placing a metal foil of copper or aluminum or the like provided on one surface or both surfaces of the single prepreg or the stacked prepregs, and subjecting the assembly to molding (curing). Any metal foil used in materials for printed wiring boards may be used without particular limitation. Techniques for conventional laminates for printing wiring boards and multilayered boards may be adopted in the lamination molding. For example, the lamination molding is generally carried out under conditions of the use of a multistage press, a multistage vacuum press, continuous molding, an autoclave molding machine or the like, a temperature of 100 to 300° C., a pressure of 2 to 100 kgf/cm$^2$, and a heating time in a range of 0.05 to 5 hr. In the present invention, a multilayered board can be formed by lamination molding of a combination of the above prepreg with a separately provided wiring board for an internal layer.

EXAMPLES

Hereinafter, the present invention will be further described in detail by Examples. However, the present invention is not limited to these Examples.

Synthesis Example Synthesis of α-Naphthol Aralkyl-Based Cyanate Ester Compound

A reactor equipped with a thermometer, a stirrer, a dropping funnel, and a reflux condenser was preliminarily cooled with brine to 0 to 5° C. 7.47 g of cyanogen chloride (0.122 mol), 9.75 g (0.0935 mol) of 35% hydrochloric acid, 76 ml of water, and 44 ml of methylene chloride were charged into the reactor. The temperature within the reactor and pH were respectively kept at −5 to +5° C. and 1 or less and a solution of 20 g (0.0935 mol) of an α-naphthol aralkyl resin wherein all Rs in the general formula (2) are hydrogen atoms (SN485, OH group equivalent: 214 g/eq., softening point: 86° C., manufactured by Nippon Steel Chemical Co., Ltd.), and 14.16 g (0.14 mol) of triethylamine dissolved in 92 ml of methylene chloride was added dropwise to the contents in the reactor through a dropping funnel over 1 hr while stirring. After the completion of the dropwise addition, 4.72 g (0.047 mol) of triethylamine was added dropwise thereto over 15 min.

After the completion of the dropwise addition, the mixture was stirred at the same temperature for 15 min. The reaction solution was then separated to obtain an organic layer. The obtained organic layer was washed twice with 100 ml of water. Methylene chloride was then removed by distillation under the reduced pressure with an evaporator, and the residue was finally concentrated to dryness at 80° C. for 1 hr to obtain 23.5 g of a cyanate ester product of an α-naphthol aralkyl resin (α-naphthol aralkyl-based cyanate ester compound).

Example 1

48 parts by mass of the α-naphthol aralkyl-based cyanate ester compound (cyanate equivalent: 261 g/eq.) prepared in Synthesis Example, 17 parts by mass of bis(3-ethyl-5-methyl-4maleimidophenyl)methane (BMI-70 manufactured by K.I. Kasei K.K.), 20 parts by mass of a polyoxynaphthylene-based epoxy resin (EXA-7311, epoxy equivalent: 277 g/eq., manufactured by DIC), 10 parts by mass of a phenol biphenyl aralkyl-based epoxy resin (NC-3000-FH, epoxy equivalent: 320 g/eq., manufactured by Nippon Kayaku Co., Ltd.), and 5 parts by mass of a naphthalene skeleton-based epoxy resin (EXA-4032, epoxy equivalent: 140 g/ep., manufactured by Dainippon Ink And Chemicals, Incorporated) were dissolved in methyl ethyl ketone and mixed. 2 parts by mass of a wet dispersing agent (disperbyk-161 manufactured by BYK Japan K.K.), 250 parts by mass of spherical fused silica (SC2050 MB manufactured by Admatex), 40 parts by mass of a silicone rubber powder having a surface covered with a silicone resin (KMP-600 manufactured by Shin-Etsu Chemical Co., Ltd.), and 0.02 part by mass of zinc octylate (manufactured by Nihon Kagaku Sangyo Co., Ltd.) were mixed to obtain a varnish. The resultant varnish was diluted with methyl ethyl ketone. The diluted varnish was impregnated into and coated on a T-glass woven fabric having a thickness of 0.1 mm and a mass of 104 g/m$^2$. The T-glass woven fabric had monofilaments with an average diameter of 7 μm. In the T-glass woven fabric, the total of the numbers of driven warp threads and weft threads was 116. The impregnated and coated T-glass woven fabric was heat-dried at 160° C. for 4 min to obtain a prepreg having a resin content of 50% by mass.

Example 2

35 parts by mass of the α-naphthol aralkyl-based cyanate ester compound used in Example 1, 15 parts by mass of bis(3-ethyl-5-methyl-4maleimidophenyl)methane, 30 parts by mass of the polyoxynaphthylene-based epoxy resin used in Example 1, 10 parts by mass of the phenol biphenyl aralkyl-based epoxy resin used in Example 1, and 10 parts by mass of a dihydroanthracene-based epoxy resin (YX8800, epoxy equivalent: 180 g/ep., manufactured by Japan Epoxy Resin Company) were dissolved in methyl ethyl ketone and mixed. 2 parts by mass of the wet dispersing agent used in Example 1, 5 parts by mass of a wet dispersing agent (disperbyk-111 manufactured by BYK Japan K.K.), 300 parts by mass of the spherical fused silica, 10 parts by mass of a silicone resin powder (Tospearl120 manufactured by Momentive Performance Materials Japan LLC), 40 parts by mass of the silicone rubber powder used in Example 1, and 0.02 part by mass of zinc octylate were mixed to obtain a varnish. The resultant varnish was diluted with methyl ethyl ketone. The diluted varnish was impregnated into and coated on the same T-glass woven fabric as that of Example 1. The impregnated and coated T-glass woven fabric was heat-dried at 160° C. for 4 min to obtain a prepreg having a resin content of 50% by mass.

Example 3

37 parts by mass of the α-naphthol aralkyl-based cyanate ester compound used in Example 1, 25 parts by mass of bis(3-ethyl-5-methyl-4maleimidophenyl)methane, 35 parts by mass of the polyoxynaphthylene-based epoxy resin used in Example 1, and 3 parts by mass of the dihydroanthracene-based epoxy resin used in Example 2 were dissolved in methyl ethyl ketone and mixed. 1 part by mass of the wet dispersing agent used in Example 1, 170 parts by mass of the spherical fused silica, 120 parts by mass of the silicone rubber powder used in Example 1, and 0.02 part by mass of zinc octylate were mixed to obtain a varnish. The resultant varnish was diluted with methyl ethyl ketone. The diluted varnish was impregnated into and coated on the T-glass woven fabric used in Example 1. The impregnated and coated T-glass woven fabric was heat-dried at 160° C. for 4 min to obtain a prepreg having a resin content of 50% by mass.

Example 4

45 parts by mass of the α-naphthol aralkyl-based cyanate ester compound used in Example 1, 10 parts by mass of bis(3-ethyl-5-methyl-4maleimidophenyl)methane, 30 parts by mass of the phenol biphenyl aralkyl-based epoxy resin used in Example 1, and 15 parts by mass of the dihydroanthracene-based epoxy resin used in Example 2 were dissolved in methyl ethyl ketone and mixed. 1 part by mass of the wet dispersing agent used in Example 1, 150 parts by mass of the spherical fused silica, 50 parts by mass of the silicone rubber powder, and 0.02 part by mass of zinc octylate were mixed to obtain a varnish. The resultant varnish was diluted with methyl ethyl ketone. The diluted varnish was impregnated into and coated on the T-glass woven fabric used in Example 1. The impregnated and coated T-glass woven fabric was heat-dried at 160° C. for 4 min to obtain a prepreg having a resin content of 50% by mass.

Example 5

45 parts by mass of the α-naphthol aralkyl-based cyanate ester compound used in Example 1, 10 parts by mass of bis(3-ethyl-5-methyl-4maleimidophenyl)methane, 15 parts by mass of the polyoxynaphthylene-based epoxy resin used in Example 1, 20 parts by mass of the phenol biphenyl aralkyl-based epoxy resin, and 10 parts by mass of the dihydroanthracene-based epoxy resin used in Example 2 were dissolved in methyl ethyl ketone and mixed. 1 part by mass of the wet dispersing agent used in Example 1, 150 parts by mass of the spherical fused silica, 50 parts by mass of the silicone rubber powder, and 0.02 part by mass of zinc octylate were mixed to obtain a varnish. The resultant varnish was diluted with methyl ethyl ketone. The diluted varnish was impregnated into and coated on the T-glass woven fabric used in Example 1. The impregnated and coated T-glass woven fabric was heat-dried at 160° C. for 4 min to obtain a prepreg having a resin content of 50% by mass.

Example 6

35 parts by mass of the α-naphthol aralkyl-based cyanate ester compound used in Example 1, 15 parts by mass of bis(3-ethyl-5-methyl-4maleimidophenyl)methane, 30 parts by mass of the polyoxynaphthylene-based epoxy resin used in Example 1, 10 parts by mass of the phenol biphenyl aralkyl-based epoxy resin, and 10 parts by mass of the dihydroanthracene-based epoxy resin used in Example 2 were dissolved in methyl ethyl ketone and mixed. 2 parts by mass of the wet dispersing agent used in Example 1, 300 parts by mass of the spherical fused silica, 10 parts by mass of the silicone resin powder used in Example 2, 40 parts by mass of the silicone rubber powder used in Example 1, and 0.02 part by mass of zinc octylate were mixed to obtain a varnish. The resultant varnish was diluted with methyl ethyl ketone. The diluted varnish was impregnated into and coated on a T-glass woven fabric having a thickness of 0.1 mm and a mass of 114 g/m$^2$. The T-glass woven fabric had monofilaments with an average diameter of 7 μm. In the T-glass woven fabric, the total of the numbers of driven warp threads and weft threads was 130. The impregnated and coated T-glass woven fabric was heat-dried at 160° C. for 4 min to obtain a prepreg having a resin content of 46% by mass.

Comparative Example 1

A prepreg was obtained in the same manner as in Example 1 except that the amount of the spherical fused silica was changed from 250 parts by mass to 90 parts by mass.

Comparative Example 2

A prepreg was obtained in the same manner as in Example 1 except that the amount of the spherical fused silica was changed from 250 parts by mass to 220 parts by mass, and the amount of the silicone rubber powder was changed from 40 parts by mass to 20 parts by mass.

Comparative Example 3

A prepreg was obtained in the same manner as in Example 4 except that 45 parts by mass of a prepolymer of 2,2-bis (4-cyanatephenyl)propane (BT2070, cyanate equivalent: 139 g/ep., manufactured by Mitsubishi Gas Chemical Co., Inc.) was used instead of the α-naphthol aralkyl-based cyanate ester compound (cyanate equivalent: 261 g/eq.), and the amount of the silicone rubber powder was changed from 50 parts by mass to 10 parts by mass.

Comparative Example 4

A prepreg was obtained in the same manner as in Example 4 except that 45 parts by mass of a prepolymer of 2,2-bis (4-cyanatephenyl)propane was used instead of the α-naphthol aralkyl-based cyanate ester compound.

Comparative Example 5

45 parts by mass of the α-naphthol aralkyl-based cyanate ester compound used in Example 1, 20 parts by mass of the polyoxynaphthylene-based epoxy resin, and 35 parts by mass of the phenol biphenyl aralkyl-based epoxy resin were dissolved in methyl ethyl ketone and mixed. 1 part by mass of the wet dispersing agent used in Example 1, 150 parts by mass of the spherical fused silica, 40 parts by mass of the silicone rubber powder, and 0.02 part by mass of zinc octylate were mixed to obtain a varnish. The resultant varnish was diluted with methyl ethyl ketone. The diluted varnish was impregnated into and coated on the T-glass woven fabric used in Example 1. The impregnated and coated T-glass woven fabric was heat-dried at 160° C. for 4 min to obtain a prepreg having a resin content of 50% by mass.

Comparative Example 6

A prepreg was obtained in the same manner as in Example 1 except that an E-glass woven fabric was used instead of the T-glass woven fabric.

Comparative Example 7

A prepreg was obtained in the same manner as in Example 5 except that the amount of the spherical fused silica was changed from 150 parts by mass to 350 parts by mass.

Comparative Example 8

A prepreg was obtained in the same manner as in Example 5 except that the amount of the spherical fused silica was changed from 150 parts by mass to 200 parts by mass, and the amount of the silicone rubber powder was changed from 40 parts by mass to 200 parts by mass.

Preparation of Metal-Clad Laminate

For the prepregs obtained in Examples 1 to 4 and Comparative Examples 1 to 7, four prepregs were superimposed on each other to form a stack. A 12 μm-thick electrolytic copper foil (3EC-III manufactured by Mitsui mining & Smelting Co., Ltd.) was disposed on the upper surface and the lower surface of the stack, and lamination molding was then performed under conditions of a pressure of 30 kgf/cm², a temperature of 220° C., and a time of 120 min to obtain a metal-clad laminate having a 0.4 mm-thick insulating layer.

Evaluation of Metal-Clad Laminate

Flame retardance, a glass transition temperature, a coefficient of thermal expansion, and moldability were evaluated using the obtained metal-clad laminates. The copper foil was removed by etching the metal-clad laminate, and the flame retardance, the glass transition temperature, and the coefficient of thermal expansion were then evaluated by the following method.

Flame retardance: evaluated according to a UL94 vertical combustion testing method.

Glass transition temperature: measured with a dynamic viscoelasticity analyzer (manufactured by TA Instruments) according to JIS C 6481.

Coefficient of thermal expansion: measured by providing a thermomechanical analyzer (manufactured by TA Instruments), raising the temperature from 40° C. to 340° C. at a temperature rise rate of 10° C./min, and measuring a coefficient of linear expansion in a plane direction from 60° C. to 120° C. The measurement direction was a warp direction of the glass cloth in the laminate.

Moldability: the copper foil of the pressed copper-clad laminate was etched, and the appearance was observed to confirm the existence or non-existence of voids. The evaluation basis was as follows.

OK: no void
NG: void existence

The results of evaluation were as shown in Tables 1 and 2 below.

TABLE 1

|  | Examples | | | | | |
| --- | --- | --- | --- | --- | --- | --- |
|  | 1 | 2 | 3 | 4 | 5 | 6 |
| flame retardance | V-0 | V-0 | V-0 | V-0 | V-0 | V-0 |
| coefficient of thermal expansion (ppm/° C.) | 4.4 | 4.1 | 3.6 | 4.8 | 4.7 | 3.7 |
| glass transition temperature (° C.) | 256 | 258 | 252 | 252 | 251 | 25 |
| moldability | OK | OK | OK | OK | OK | OK |

TABLE 2

|  | Comparative Examples | | | | | | | |
| --- | --- | --- | --- | --- | --- | --- | --- | --- |
|  | 1 | 2 | 3 | 4 | 5 | 6 | 7 | 8 |
| flame retardance | V-0 | V-0 | V-1 | V-0 | V-0 | V-0 | — | — |
| coefficient of thermal expansion (ppm/° C.) | 5.5 | 5.1 | 5.7 | 5.0 | 5.1 | 7.5 | — | — |
| glass transition temperature (° C.) | 256 | 256 | 240 | 240 | 232 | 255 | — | — |
| moldability | OK | OK | OK | OK | OK | OK | NG | NG |

From Tables 1 and 2, it was clear that the metal-clad laminates obtained in Examples 1 to 6 had a coefficient of thermal expansion lower than those of Comparative Example 1 having the less compounded amount of the fused silica and Comparative Example 2 having the less compounded amount of the silicone rubber powder with the surface of coated with a silicone resin.

In Comparative Examples 3 and 4, the prepolymer of 2,2-bis(4-cyanatephenyl)propane is used instead of the naphthol aralkyl-based cyanate ester compound. Comparative Examples 3 and 4 have flame retardance and a glass transition temperature lower than those of Examples.

Comparative Examples using the glass cloth made of the E-glass instead of the glass cloth made of the S-glass or the T-glass as the substrate have a coefficient of thermal expansion in the plane direction lower than those of Examples.

Furthermore, Comparative Example 7 in which the amount of the fused silica was increased and Comparative Example 8 in which the amount of the silicone rubber powder having the surface covered with the silicone resin was increased had remarkably low moldability, and could not obtain the metal-clad laminate.

The invention claimed is:

1. A resin composition comprising a cyanate ester compound (A), a maleimide compound (B), an epoxy resin (C), a silicone rubber powder (D), and an inorganic filler (E), wherein the cyanate ester compound (A) comprises a compound represented by the following formula (I):

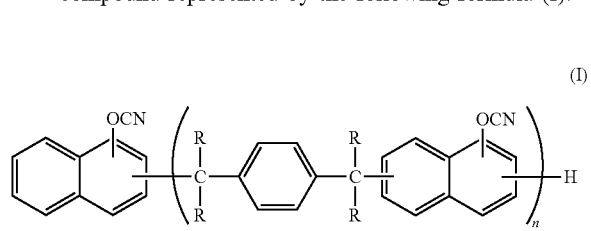

wherein R represents a hydrogen atom or a methyl group, and n represents an integer of 1 or more;

the silicone rubber powder (D) is contained in an amount of 40 to 150 parts by mass based on 100 parts by mass in total of the cyanate ester compound (A), the maleimide compound (B), and the epoxy resin (C);

the inorganic filler (E) is contained in an amount of 100 to 340 parts by mass based on 100 parts by mass in total of the cyanate ester compound (A), the maleimide compound (B), and the epoxy resin (C); and a total content of the silicone rubber powder (D) and the inorganic filler (E) is 140 to 380 parts by mass based on 100 parts by mass in total of the cyanate ester compound (A), the maleimide compound (B), and the epoxy resin (C).

2. The resin composition according to claim 1, wherein the inorganic filler (E) is at least one selected from the group consisting of silicas, a metal hydrate, zinc borate, aluminum oxide, boron nitride, magnesium oxide, aluminum nitride, silicon nitride, and magnesium carbonate.

3. The resin composition according to claim 2, wherein the inorganic filler (E) comprises the silicas.

4. The resin composition according to claim 1, wherein the epoxy resin (C) comprises a polyoxynaphthylene-based epoxy resin represented by the following formula (II):

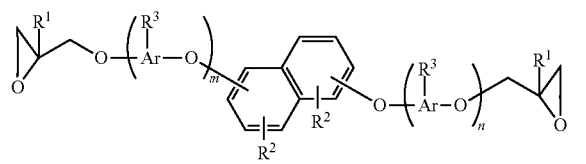

wherein each of Ar independently represents a naphthylene or phenylene group, provided that at least one hydrogen atom in both the naphthylene and phenylene groups may be substituted by an alkyl group having 1 to 4 carbon atoms or a phenylene group;

$R^1$ represents a hydrogen atom or a methyl group;

each of $R^2$ independently represents a hydrogen atom, an alkyl group having 1 to 4 carbon atoms, or an aralkyl group represented by the following formula (III):

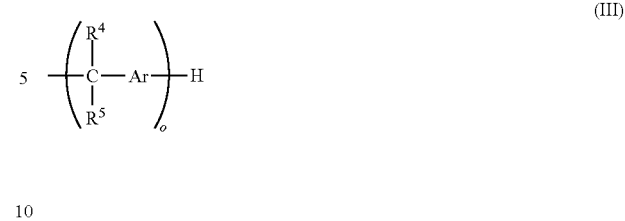

wherein $R^4$ and $R^5$ each independently represent a hydrogen atom or a methyl group; Ar represents a phenylene or naphthylene group, provided that 1 to 3 hydrogen atoms in the phenylene or naphthylene group may be nuclearly substituted by an alkyl group having 1 to 4 carbon atoms; and o is a real number of 0.1 to 4 on average; and $R^3$ represents a hydrogen atom, an aralkyl group represented by the formula (III), or an epoxy group-containing aromatic hydrocarbon group represented by the following formula (IV):

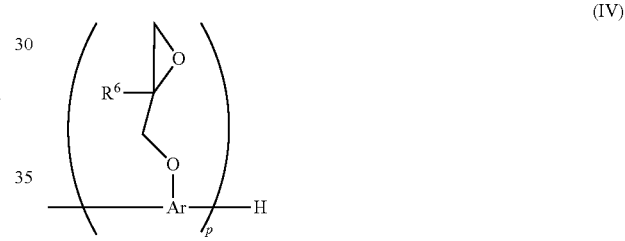

wherein $R^6$ represents a hydrogen atom or a methyl group; Ar represents a naphthylene group, provided that at least one hydrogen atom in the naphthylene group may be substituted by an alkyl group having 1 to 4 carbon atoms, an aralkyl group, or a phenylene group; and p is an integer of 1 or 2;

m and n each are an integer of 0 to 4, provided that m and n are not simultaneously 0; and the position of binding to the naphthalene structure site may be any of the 1- to 8-positions.

5. The resin composition according to claim 4, wherein Ar in the formula (II) is a naphthylene group, provided that at least one hydrogen atom in the naphthylene group may be substituted by an alkyl group having 1 to 4 carbon atoms or a phenylene group.

6. The resin composition according to claim 4, wherein m and n in the formula (II) are an integer of 0 to 2, provided that m and n are not simultaneously 0.

7. The resin composition according to claim 4, wherein the epoxy resin (C) comprises at least one or more selected from the group consisting of compounds represented by the following formula (V) and the following formula (VI):

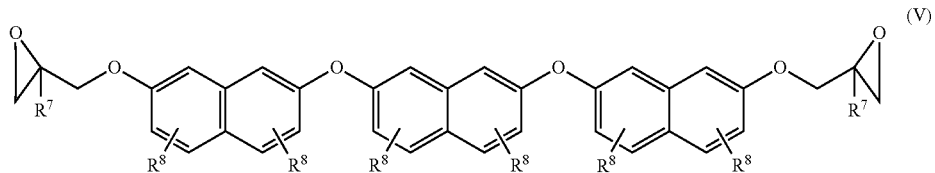
(V)

wherein $R^7$ represents a hydrogen atom or a methyl group; and each of $R^8$ independently represents a hydrogen atom, an alkyl group having 1 to 4 carbon atoms, or an aralkyl group represented by the formula (III);

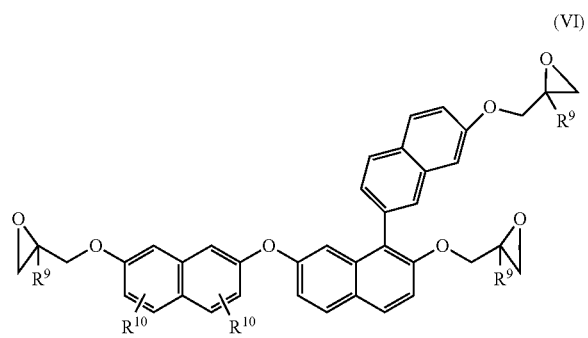
(VI)

wherein $R^9$ represents a hydrogen atom or a methyl group; and each of $R^{10}$ independently represents a hydrogen atom, an alkyl group having 1 to 4 carbon atoms, or an aralkyl group represented by the formula (III).

8. The resin composition according to claim 4, wherein the epoxy resin (C) comprises a polyoxynaphthylene-based epoxy resin represented by the formula (II) and an anthracene-based epoxy resin.

9. The resin composition according to claim 8, wherein the anthracene-based epoxy resin comprises a dihydroanthracene-based epoxy resin represented by the following formula (VII):

wherein $R^{11}$ to $R^{20}$ each independently represent a hydrogen atom or an alkyl group having 1 to 6 carbon atoms; and n represents an integer of 0 or more.

10. The resin composition according to claim 1, wherein the cyanate ester compound (A) is contained in an amount meeting a ratio (CN/Ep) in a range of 0.65 to 2.5 wherein CN represents the number of cyanate groups in the cyanate ester compound (A); and Ep represents the number of epoxy groups in the epoxy resin (C).

11. The resin composition according to claim 1, wherein the maleimide compound (B) is contained in an amount of 3 to 50 parts by mass based on 100 parts by mass in total of the cyanate ester compound (A), the maleimide compound (B), and the epoxy resin (C).

12. A prepreg comprising: a substrate; and the resin composition according to claim 1 impregnated into or coated on the substrate.

13. The prepreg according to claim 12, wherein the substrate is a glass cloth made of S-glass or T-glass.

14. The prepreg according to claim 13, wherein provided that warp threads and weft threads of the glass cloth are made of monofilaments with an average diameter of 5 μm or more; the number of the driven warp threads is defined as X (thread/inch); and the number of the driven weft threads is defined as Y (thread/inch), the total of X and Y is 110 to 200.

15. The prepreg according to claim 13, wherein provided that warp threads and weft threads of the glass cloth are made of monofilaments with an average diameter of 4.5 μm or less; the number of the driven warp threads is defined as X (thread/inch); and the number of the driven weft threads is defined as Y (thread/inch), the total of X and Y is 130 to 240.

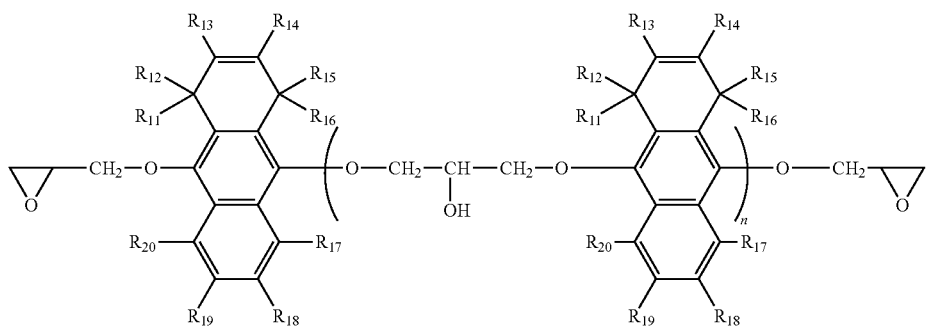
(VII)

16. A laminate obtained by curing the prepreg according to claim 12.

17. A metal foil-clad laminate obtained by stacking and curing the prepreg according to claim 12 and a metal foil.

* * * * *